(12) United States Patent
Christian et al.

(10) Patent No.: US 8,760,911 B2
(45) Date of Patent: Jun. 24, 2014

(54) MEMORY SYSTEM CONFIGURED FOR USE IN A BINARY PREDICTOR

(76) Inventors: Matthew Christian, Santa Monica, CA (US); Jonathan R Joshi, Los Angeles, CA (US)

(*) Notice: Subject to any disclaimer, the term of this patent is extended or adjusted under 35 U.S.C. 154(b) by 170 days.

(21) Appl. No.: 13/439,590

(22) Filed: Apr. 4, 2012

(65) Prior Publication Data

US 2013/0265817 A1 Oct. 10, 2013

(51) Int. Cl.
| | |
|---|---|
| G11C 11/24 | (2006.01) |
| G11C 11/40 | (2006.01) |
| G11C 11/404 | (2006.01) |
| G11C 11/405 | (2006.01) |

(52) U.S. Cl.
CPC ............... *G11C 11/24* (2013.01); *G11C 11/40* (2013.01); *G11C 11/404* (2013.01); *G11C 11/405* (2013.01)
USPC .......................................................... 365/149

(58) Field of Classification Search
CPC ...... G11C 11/24; G11C 11/40; G11C 11/404; G11C 11/405

USPC .......................................................... 365/149
See application file for complete search history.

(56) References Cited

U.S. PATENT DOCUMENTS

| | | | | |
|---|---|---|---|---|
| 6,567,333 | B2* | 5/2003 | Toda | 365/225.7 |
| 6,625,056 | B1* | 9/2003 | Kihara | 365/149 |
| 7,633,784 | B2* | 12/2009 | Thummalapally | 365/49.12 |
| 7,859,930 | B2* | 12/2010 | Foss | 365/207 |

* cited by examiner

*Primary Examiner* — Hoai V Ho
*Assistant Examiner* — Tri Hoang
(74) *Attorney, Agent, or Firm* — Nikia L. Gray; Quarles & Brady LLP

(57) ABSTRACT

A memory system includes a plurality of memory cells. Each memory cell includes a first storage cell including a first capacitor configured to store a first analog charge representing a first Boolean value, a second storage cell including a second capacitor configured to store a second analog charge representing a second Boolean value, and a charging path configured to apply, for a first time duration, a voltage to the first capacitor or the second capacitor during a write operation. Each memory cell includes a voltage comparator configured to output a Boolean value based upon a comparison of the first analog charge and the second analog charge during a read operation.

14 Claims, 9 Drawing Sheets

MEMORY SYSTEM CONFIGURED FOR USE IN A BINARY PREDICTOR

BACKGROUND OF THE DISCLOSURE

1. Field of the Disclosure

The present disclosure relates to a memory system that may be incorporated into or used by a binary predictor, such as, but not limited to, a branch predictor.

2. Description of the Background of the Disclosure

Binary predictors are electronic circuits that analyze the outcomes of prior decisions in order to predict a future outcome of the same decision. The circuits have a number of potential applications including speculative run-ahead processing with inhibition, speculative resource access with inhibition in a synchronization environment, context switch control logic for a multithreaded system, and history based neural networks and neuromorphic circuits. In many cases, the circuits are used for branch prediction within modern microprocessors.

Many microprocessors are capable of executing instructions either sequentially or non-sequentially by skipping certain sequential instructions. These non-sequential instructions can be referred to as a branch. Sometimes a processor will jump to a particular branch based upon the result of an evaluation of a conditional jump statement. Until that conditional jump statement is evaluated, the processor cannot know to which branch a particular program will jump.

Without branch prediction, therefore, the processor must first execute the conditional jump statement before the processor can begin retrieving and executing the instructions associated with the target branch. Because it takes time to fetch the instructions associated with the target branch, this can result in a substantial delay in the execution of new instructions after a conditional jump statement is evaluated.

To minimize this delay, processors often incorporate branch predictors. A branch predictor attempts to predict the next instruction address to be executed by the microprocessor following a conditional jump statement. The predicted next instruction address is then fetched from the target branch to avoid delay in executing the branch's instructions. Sometimes the prediction is incorrect, in which case the delay described above may occur before the correct instruction can be fetched and executed.

Branch predictors often use DRAM to analyze the results of previous decisions. These memory devices are volatile, requiring regular refreshing to avoid information loss. The refreshing results in a substantial increase in energy consumed by the devices. Additionally, when reading values from the memory devices of conventional branch predictors, a significant amount of energy is consumed from the capacitive element storing the binary value. The amount of energy consumed by reading the stored value must then be recharged, again consuming energy.

In some cases, microprocessors use multiple threads of distinct execution paths to improve their efficiency. When one thread reaches a long latency operation that blocks the processor's execution flow, like a miss on a cache access in the memory hierarchy system, the processor will perform a context switch and start to execute a different thread on the central processing unit. Sometimes it can be advantageous for the processor to speculatively continue past a long latency operation on a thread's execution path to seek out additional long latency operations that can be performed in parallel.

A binary predictor could be used in such a system to make predictions of whether a processor should speculatively continue operating past a long latency operation, and perhaps whether the processor should switch to a new thread or simply conserve power.

SUMMARY OF THE INVENTION

In one implementation, the present invention is a memory system. The memory system includes a plurality of memory cells. Each memory cell includes a first storage cell including a first capacitor configured to store a first analog charge representing a first Boolean value, a second storage cell including a second capacitor configured to store a second analog charge representing a second Boolean value, and a charging path configured to apply, for a first time duration, a voltage to the first capacitor or the second capacitor during a write operation. Each memory cell includes a voltage comparator configured to output a Boolean value based upon a comparison of the first analog charge and the second analog charge during a read operation.

In another implementation, the present invention is a memory system including a plurality of memory cells. Each memory cell includes a storage cell including a capacitor configured to store a first analog charge representing a Boolean value, and a charging path configured to apply, for a first time duration, a voltage to the capacitor during a write operation. The first time duration is less than a duration of the write operation. Each memory cell includes a voltage comparator configured to output a Boolean value based upon a comparison of the first analog charge to a second analog charge during a read operation.

In another implementation, the present invention is a memory cell including a first storage cell including a first capacitor configured to store a first analog charge representing a first Boolean value, a second storage cell including a second capacitor configured to store a second analog charge representing a second Boolean value, a charging path configured to apply, for a first time duration, a voltage to the first capacitor or the second capacitor during a write operation, and a voltage comparator configured to output a Boolean value based upon a comparison of the first analog charge and the second analog charge during a read operation.

DETAILED DESCRIPTION OF THE DRAWINGS

Figure 1:
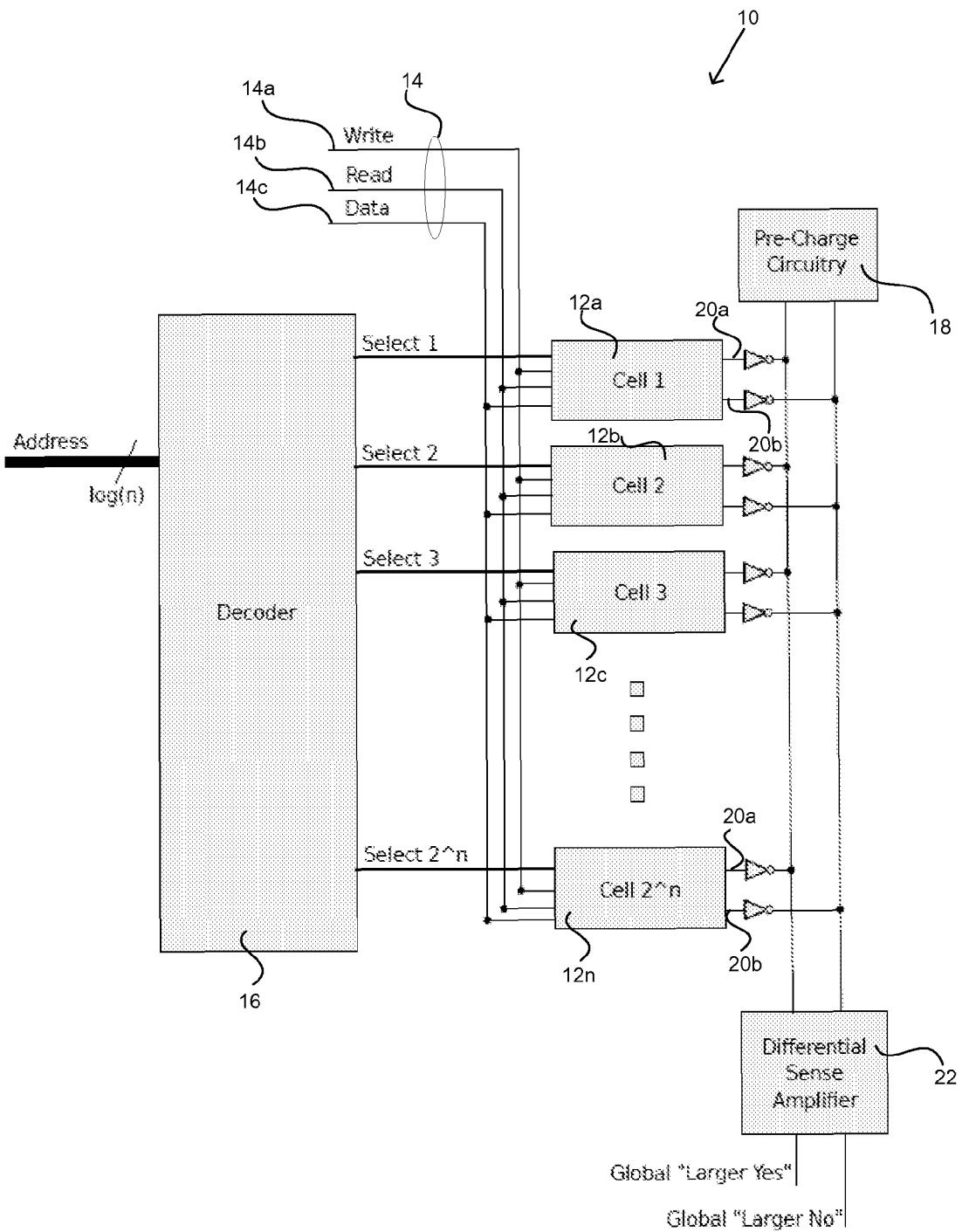
FIG. 1 is block diagram showing functional components of a memory system for a binary predictor arranged in accordance with the present disclosure.

The present system is a memory system that may be used in a binary predictor. The predictor includes a binary decision block that considers the outcomes of previous decisions. Based upon that analysis, the system produces a binary prediction when accessed.

The memory system includes an array of memory cells. Each memory cell stores a value that can be retrieved and evaluated to one of two Boolean output values. The memory cells each include two separate storage cells. The first storage cell is associated with a first Boolean value (e.g., 'yes' or '1') and the second storage cell is associated with the other Boolean value (e.g., 'no' or '0').

Each of the two storage cells within each memory cell is configured to store an analog charge value. The output of the memory cell is then determined by which one of the two storage cells has a greater charge. If, for example, the storage cell associated with the Boolean value '0' has a greater charge than the storage cell associated with the Boolean value '1', the output of the memory cell is '0', and vice versa. If the voltages across each storage cell within a particular memory cell are approximately equal, the system can be configured to allocate that memory cell a default value.

When a value is written to a particular memory cell, the Boolean value is inputted into the memory cell causing a small amount of charge to be added to the storage cell associated with that Boolean value. As additional writes are made to that storage cell, the charge stored therein will increase as it is accumulated.

Because each write action causes charge to accumulate with the storage cells of a memory cell, the Boolean value outputted by a particular memory cell will be reflective of a number of prior write instructions, rather than only the most recent write instruction. If, for example, the execution of a number of decisions causes a particular memory cell to receive ten write instructions for a Boolean value of '1', followed by a single write instruction for a Boolean value of '0', the storage cell associated with the Boolean value '1' will have more charge stored therein than the storage cell associated with the Boolean value of '0' (presuming no losses). Accordingly, the memory cell will output a value of '1' rather than '0', even though the most recently received write action was for a value of '0'.

In various implementations, the charge stored by a particular storage cell will, in fact, dissipate or leak over time. As the voltage stored in a particular storage cell decays, the charge contributed by earlier write instructions will be more dissipated than the charge contributed by more recent write instructions. This has the result of adding weight to the values of more recent write actions. This can be an important attribute of memory systems used in binary prediction because the results of more recent decision evaluations (that are stored in the memory cell) are more likely to be accurate than the results of decisions executed further in the past. Additionally, by allowing the storage cells to discharge over time, the present memory system requires much less power than conventional memory systems that call for routinely refreshing values stored in volatile memory.

In the present system, the memory cells can be arranged using a conventional memory architecture allowing each storage cell (and each corresponding decision) to be addressed using conventional memory addressing techniques.

The present memory system and corresponding binary predictor can be used in a number of applications calling for the analysis of prior decisions to make a prediction. One such application involves branch prediction as implemented in microprocessors. Other applications include speculative run-ahead processing with inhibition, speculative resource access with inhibition in a synchronization environment, context switch control logic for a multithreaded system, and history based neural networks and neuromorphic circuits.

FIG. 1 is block diagram showing functional components of a memory system for a binary predictor. Memory system 10 includes several memory cells 12 (e.g., memory cells 12a, 12b, 12C, . . . 12n). Each memory cell 12 is configured to store and output a value that is indicative of the outcomes of previous decisions (e.g., the outcomes of prior evaluations of conditional statements). In the present implementation, each memory cell 12 stores information as a combination of two analog values, which can be compared and the result retrieved from the memory cell. The result is then converted into a Boolean value.

The values stored by each memory cell 12 can be retrieved using a read function, or the stored values can be modified or updated using a write function. The read and write functions of the memory system 10 are accessed using the Write, Read, and Data control lines 14 shown in FIG. 1. To read a stored value from a memory cell, for example, the Read control line 14b is set to a high value (e.g., $V_{dd}$), while the Write 14a and Data 14c lines are set to low values (e.g., $V_{ground}$). When reading a value of a particular memory cell 12, a voltage stored by the memory cell that corresponds to a particular Boolean value stored by the cell is outputted by the memory cell at output pins 20a and 20b, as discussed below. Conversely, to write data to a memory cell the Read control line 14b is set to a low value, while the Write control line 14a is set to a high value. In that case, the value of Data line 14c (e.g., either a high or low value, depending upon the input Boolean value) will be written to the memory cell.

Because memory system 10 includes a number of memory cells 12, the system includes address decoder 16 that allows for a particular memory cell 12 to be selected or addressed during write and read operations. When an address is supplied to decoder 16, the values inputted at control lines 14 are routed to the addressed memory cell. As such, a particular read or write operation can be directed to a single memory cell 12 without affecting the state of the remaining memory cells or incorrectly reading a value from another memory cell 12.

In the architecture shown in FIG. 1, because the memory cells are arranged linearly with only a single memory cell per row, the memory system does not require a column decoder. In other implementations of memory system 10, however, the memory cells may have a different arrangement calling for decoder 16 as well as a column decoder in order to correctly address a particular memory cell. In that case, the memory system 10 may have an architecture somewhat similar to conventional dynamic random access memory (DRAM) or static random access memory (SRAM) systems.

As shown in FIG. 1, the output of each memory cell 12 includes two output pins 20a and 20b. When reading from a particular memory cell, the memory cell outputs an analog voltage at each of the memory cell's output pins 20a and 20b. The voltage measured at a first pin (e.g., 20a) is associated with a first Boolean value, while the voltage measured at the other output pin (e.g., 20b) is associated with the other Boolean value. Whichever voltage is higher is considered to be the Boolean output value of the memory cell.

To facilitate the reading of an output from one of memory cells 12, the memory system 10 includes pre-charge or amplification circuitry 18. Because the capacitance of the output lines of each memory cell 12 is very high, it can be difficult to detect the relatively small output voltages of a particular memory cell 12. Accordingly, amplification circuitry 18 amplifies the small changes on the output lines of memory cells 12 when a value is being read therefrom. The amplified output values from the memory cells 12 are then transmitted to differential sense amplifier 22. Differential sense amplifier 22 compares the two amplified voltages measured at the two output pins 20a and 20b of the memory cell 12 from which a value is currently being read and determines which voltage is higher. After determining which voltage is higher, differential sense amplifier 22 (or additional circuitry connected thereto) outputs the Boolean value that is associated with the output pin 20 of the memory cell 12 having the larger measured voltage. That Boolean voltage can then be used by components connected to the memory system 10 in any suitable manner, such as in branch prediction in a microprocessor.

Figure 2:
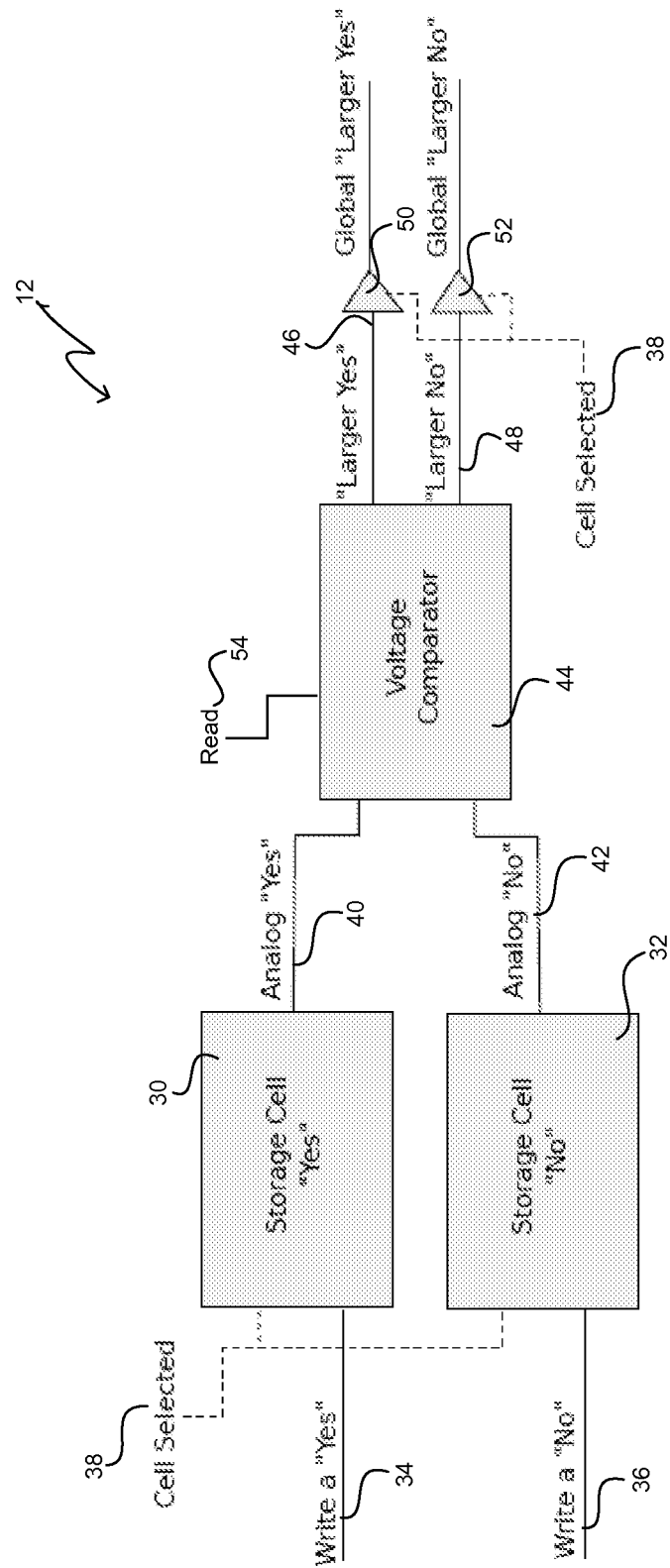
FIG. 2 is a block diagram showing functional components of an individual memory cell of a memory system, such as the memory system shown in FIG. 1.

FIG. 2 is a block diagram showing functional components of an individual memory cell 12. Memory cell 12 includes two storage cells 30 and 32. Each storage cell 30 and 32 is a capacitive cell arranged to store an analog charge or voltage value. For example, as shown in FIG. 2, storage cell 30 stores an analog value associated with the Boolean value "yes", while storage cell 32 stores an analog value associated with the Boolean value "no".

Each of storage cells 30 and 32 has inputs 34 and 36, respectively, whereby an input value is provided to each storage cell. Inputs 34 and 36 are derived from an input data value received from a data line, such as the Data control line 14c shown in FIG. 1.

Memory cell 12 also receives a cell select input 38 received from decoder 16 (see FIG. 1). As discussed above, cell select input 38 is used to control whether memory cell 12 is selected (i.e., operational) during write or read operations.

Because each of storage cells 30 and 32 store analog values, their respective outputs 40 and 42 are analog voltages reflective of an amount of charge stored by each storage cell. The analog output of each storage cell 30 and 32 is supplied to voltage comparator 44. Voltage comparator 44 determines which storage cell has the highest voltage stored thereon. After making the determination, voltage comparator 44 outputs a Boolean value indicative of which storage cell 30 or 32 has a higher charge stored thereon. That Boolean value may then be amplified becoming the output of memory cell 23.

Figure 3:
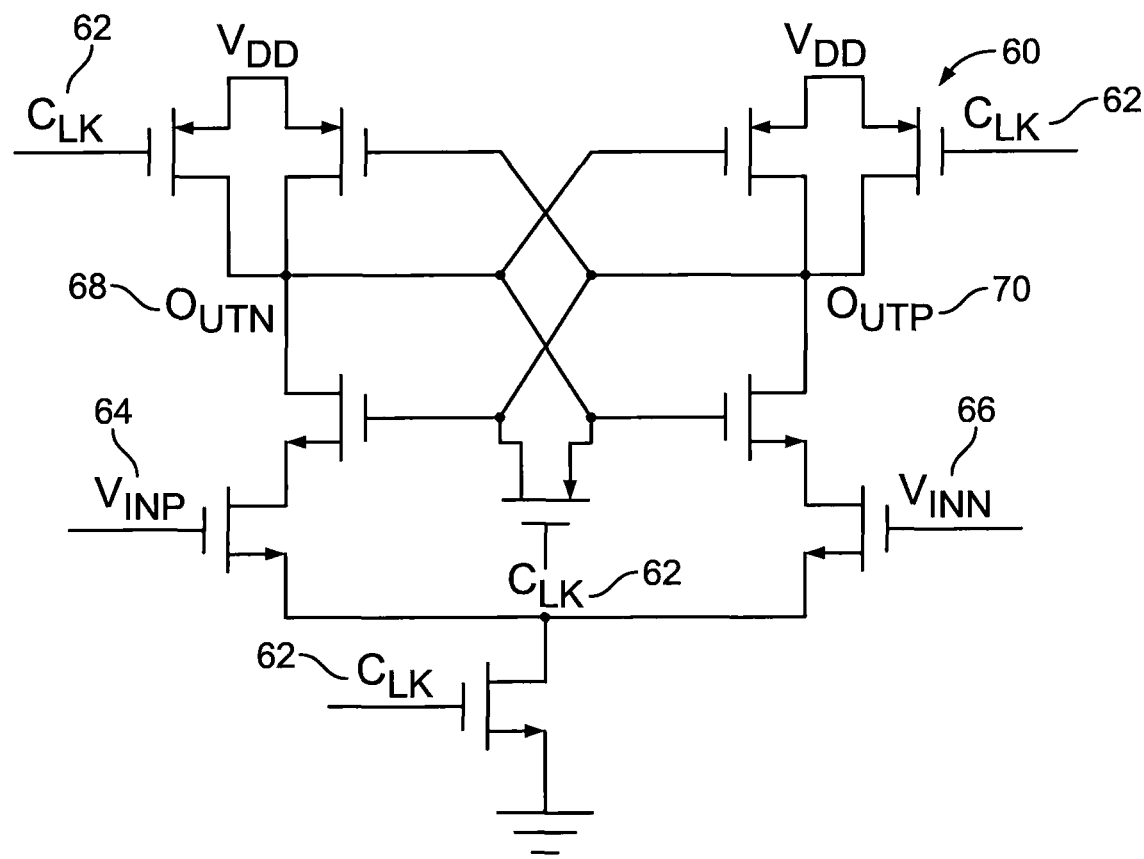
FIG. 3 is a circuit diagram for a dynamic latched comparator.

Depending on the implementation, voltage comparator 44 may be implemented as any suitable analog voltage comparator. FIG. 3, for example, shows a dynamic latched comparator 60 that may be used to implement voltage comparator 44 of FIG. 2. Comparator 60 is a clocked comparator receiving clock inputs 62. $V_{INP}$ 64 receives an analog voltage input from the storage cell that stores an analog value associated with a positive or "yes" Boolean value (e.g., storage cell 30 of FIG. 2). Conversely, $V_{INN}$ 66 receives an analog voltage input from the storage cell that stores an analog value associated with a negative or "no" Boolean value (e.g., storage cell 32 of FIG. 2).

Comparator 60 compares the two analog inputs received via inputs $V_{INP}$ 64 and $V_{INN}$ 66 and determines which input is of greater magnitude. If input $V_{INP}$ 64 is greater than $V_{INN}$ 66, comparator sets output $O_{UTP}$ 70 to a high Boolean value (e.g., approximately $V_{DD}$) and $O_{UTN}$ 68 to a low value (e.g., approximately ground). Conversely, when $V_{INP}$ 64 is less than $V_{INN}$ 66, comparator sets output $O_{UTN}$ 68 to a high Boolean value (e.g., approximately $V_{DD}$) and $O_{UTP}$ 70 to a low value (e.g., approximately ground). $O_{UTN}$ 68 can correspond to output 48 of voltage comparator 44 of FIG. 2, and $O_{UTP}$ 70 can correspond to output 46 of voltage comparator 44 of FIG. 2.

Comparator 60, during operation, allows for non-destructive reads of the values stored within the two connected storage cells. This minimizes that amount of energy consumed from each storage cell in order to determine which storage cell is storing a large analog voltage. Additionally, non-destructive reads made by comparator 60 allow the relative analog value of a "yes" or "no" Boolean value stored in a particular storage cell to not be destroyed during prediction. As a consequence, the history of a particular decision will continue to affect future predictions. In some implementations, the output lines of the comparator are buffered from the relatively high capacitance bit lines of the remaining circuitry of the predictor to improve the performance of the comparator.

Returning to FIG. 2, outputs 46 and 48 may each be connected to amplifiers 50 and 52, respectively, to amplify the relatively small output of voltage comparator 44. As shown in FIG. 2, each of amplifiers 50 and 52 receive cell select input 38 and are configured to only operate when memory cell 12 is selected.

To control the operation of voltage comparator 44, voltage comparator 44 receives as an input read control line 43 (corresponding to the Read control line 14b of FIG. 1). Voltage comparator 44 only operates (and generates or modifies the output values) when read control line 54 being fed into voltage comparator 44 has a high value.

With regards to FIG. 2, voltage comparator 44 identifies the larger of the analog values received from storage cells 30 and 32. The differential sense amplifier 22 (see FIG. 1) detects a small drop in voltage on the precharged output lines connected to every cell 12 (see FIG. 1). If comparator 44 were required to drive the large output lines of each memory cell, comparator 44 may require larger transistors potentially resulting in unwanted capacitance and noise being added to the analog signals. Amplifiers 50 and 52 buffer the output lines of comparator 44 from the relatively large capacitances of the output lines, so that voltage comparator 44 can very quickly switch one way or other without having to alter the charge of that relatively large capacitance. It is important to note that there may be different ways of implementing the comparator/buffer/differential sense amplifier combination. The examples of FIGS. 1 and 2 are merely intended to be illustrative.

Figure 4:
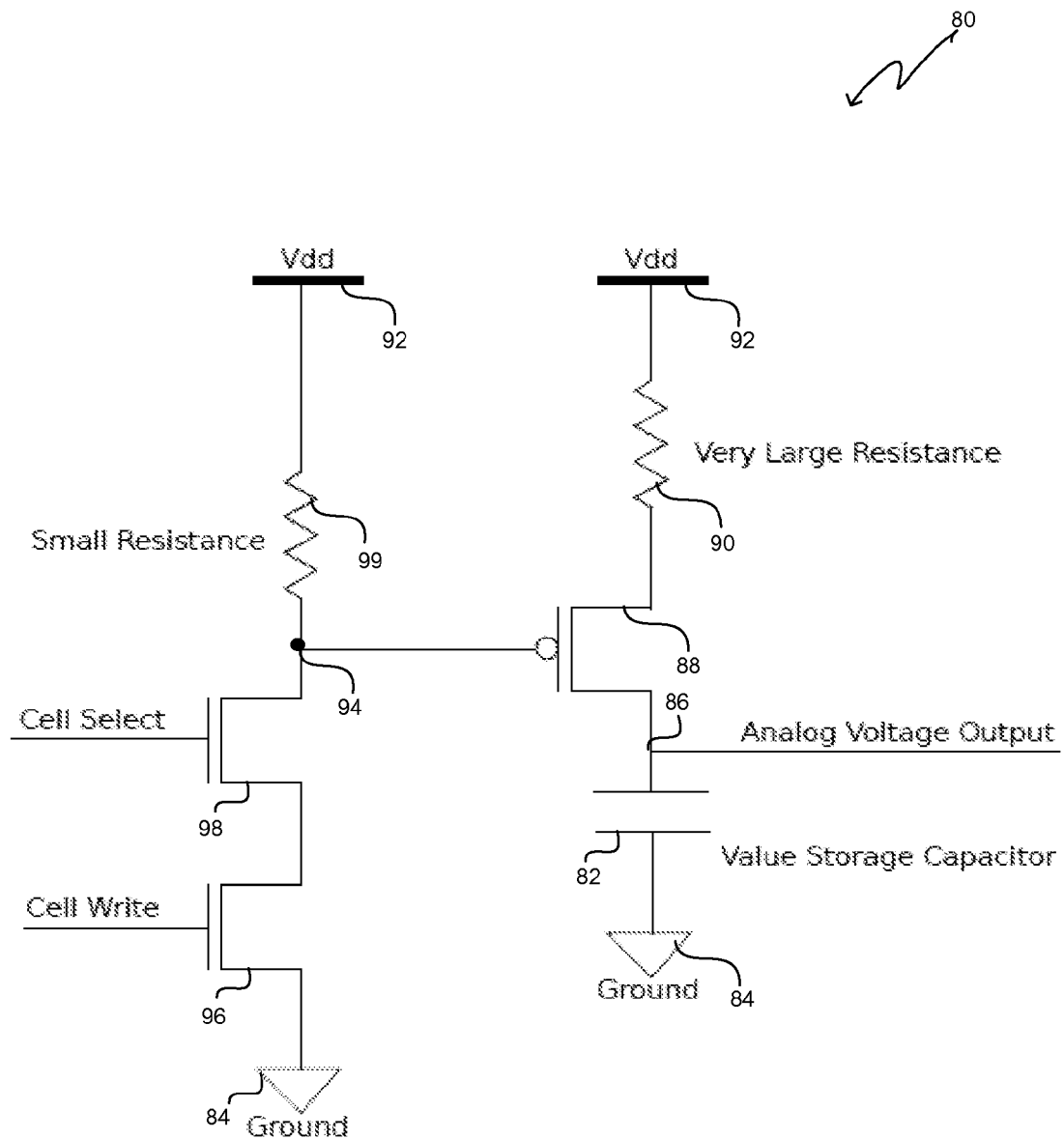
FIG. 4 is a schematic showing the functional components of a storage cell, such as either of storage cells 30 and 32 shown in FIG. 2.

FIG. 4 is a schematic showing the functional components of storage cell 80, such as either of storage cells 30 and 32 shown in FIG. 2. Cell 80, as discussed above, is configured to store an analog value. The analog value stored by cell 80 can be modified by selecting the storage cell (via a select control line) and supplying an appropriate write signal to the cell. The value stored by cell 80 can also be read from cell 80.

Cell 80 includes capacitor 82 configured to store an analog charge value. Capacitor 82 is connected to ground node 84 and output node 86. The output of storage cell 80 is measured across capacitor 82 at output node 86.

P-Type transistor 88 is connected between output node 86 and resistor 90. Resistor 90 is connected to Km node 92. The resistance value of resistor 90 is selected to be relatively large to cause a relatively low current flow from $V_{dd}$ node 92 into capacitor 82 when transistor 88 is conducting. In other implementations, though, because only a small amount of charge is added to a particular storage cell during a write operation, the resistance of resistor 90 can be relatively small (i.e., 60 kilo Ohms).

The conductive state of transistor 88 is controlled by the value of node 94. When node 94 is high, transistor 88 does not conduct. When node 94 is low, transistor 88 is put into a conductive state allowing capacitor 82 to be charged by $V_{dd}$ node 92. Node 94 is connected to $V_{dd}$ node 92 through pull-up resistor 99. In one implementation, resistor 99 has a relatively large resistance of approximately 200 kilo Ohms.

Node 92 is also connected to N-type transistor 98. Transistor 98 receives the cell select control signal (e.g., generated by decoder 16 of FIG. 1) as an input. When cell select is high (i.e., the memory cell containing storage cell 80 is selected), transistor 98 is put into a conductive state. Transistor 98 is connected to N-type transistor 96. Transistor 96 receives a Cell Write control signal as an input. When Cell Write is high, transistor 96 is put into a conductive state. Transistor 96 is connected to ground node 84.

With reference to FIG. 4, to write a value (i.e., add charge) to storage cell 80, both inputs Cell Select (controlling transistor 98) and Cell Write (controlling transistor 96) are set to high values. With both of those values set to high values, node 94 is pulled down to ground (because both transistors 98 and 96 are now conducting) thereby over-powering pull-up resistor 99. With node 94 pulled to ground, transistor 88 begins conducting causing charge to enter capacitor 82 through resistor 90. Because resistor 90 has a relatively large value, only small amounts of charge will enter and be stored upon capacitor 82 depending upon how long the Cell Select and Write control lines are high.

Each time a write is performed on storage cell 80, only a small amount of charge is allowed to flow into capacitor 84 causing the voltage measured at output node 86 to increase by a relatively small amount. The amount of charge added to the capacitor with each write operation is relative the strength of the current through the capacitor, which is determined by $V_{DS}$ and $V_{GS}$ across transistor 88. As the voltage on the capacitor increases, though, the current added during each write operation decreases non-linearly. For example, in one implementation, the initial write to the capacitor (i.e., when the capacitor has a voltage of zero before the write operation), the initial charge causes the voltage across the capacitor to reach approximately 46% of the capacitor's maximum value. The amount of charge added to the capacitor in subsequent write cycles, though, varies between 2.5% and 6% of the total charge capacity of the capacitor. This is achieved by only turning on transistor 88 for a short time period. As such, it would require a repeated number of write cycles before the voltage at output node 86 begins to approach the voltage at $V_{dd}$ node 92.

Figure 5:
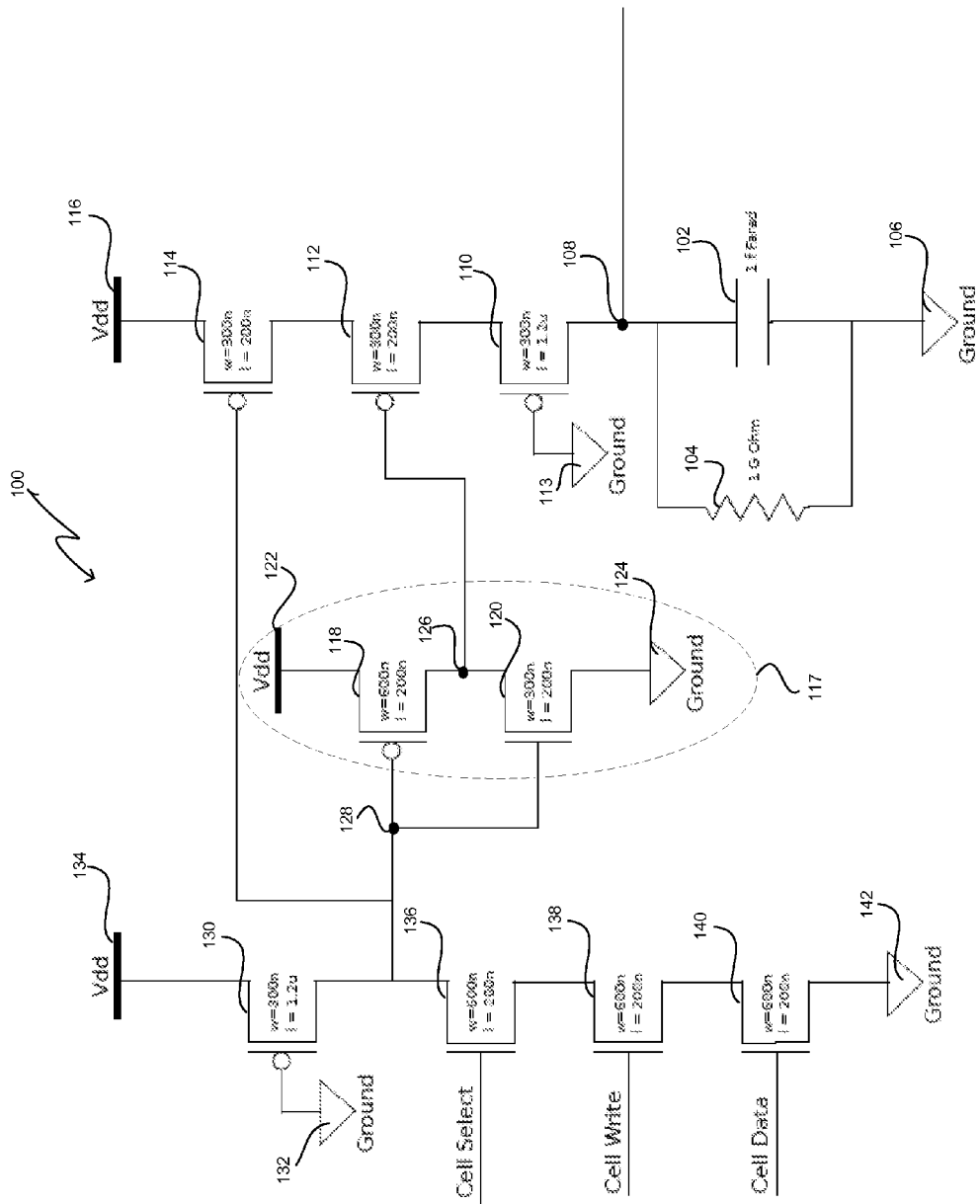
FIG. 5 is a schematic showing an electric circuit layout for implementing a storage cell.

FIG. 5 is a schematic showing an electric circuit layout for implementing a storage cell. Storage cell 100 includes capacitor 102 for storing the analog charge associated with the storage cell. Capacitor 102 has a relatively large capacitance (e.g., 1 femto Farad). A leakage resistor 104 (included for modeling purposes) is connected in parallel with capacitor 102. An example resistance of resistor 104 is approximately 1 Giga Ohm—depending upon the system implementation. In an actual implementation, capacitor 102 can be replaced by a capacitive storage component, such as a DRAM capacitor.

Capacitor 102 is connected to ground node 106 and output node 108. Output node 108 provides a reference node from which the voltage of capacitor 102 can be measured.

P-type transistor 110 is connected to output node 108. The gate of transistor 110 is tied to ground node 113 causing transistor 110 to be permanently biased in a conducting mode. In this arrangement transistor 110 operates as a buffer to insulate capacitor 102 from noise and capacitive coupling from the other transistors along the capacitor's charging path (e.g., transistors 112 and 114). Depending upon the system implementation, though, this buffer may be unnecessary as a number of other components, such as guard rings and other methods, can be used to isolate capacitor 102 from harmful parasitics of the circuit.

Transistor no is connected to p-type transistor 112, which, in turn, is connected to p-type transistor 114. Transistor 114 is connected to $V_{dd}$ node 116.

The gate of transistor 112 is connected to inverter 117 comprising p-type transistor 118 and n-type transistor 120. Transistor 118 is connected to $V_{dd}$ node 122 and transistor 120 is connected to ground node 124. The inverter's output node 126 is connected to the gate of transistor 112 and the input node 128 of the inverter is connected to the gates of transistors 118 and 120.

When node 128 is low, transistor 118 is conductive and transistor 120 is non-conductive. In that arrangement the voltage at node 126 is pulled up to that of $V_{dd}$ node 122 causing transistor 112 to be non-conductive. Conversely, when node 128 is high, transistor 118 is non-conductive and transistor 120 is conductive. In that arrangement the voltage at node 126 is pulled down to that of ground node 124 causing transistor 112 to be conductive.

Node 128 is connected to p-type transistor 130. The gate of transistor 130 is connected to ground node 132 causing transistor 130 to be permanently biased in a conducting mode. Transistor 130 is connected to $V_{dd}$ node 134. In this arrangement, transistor 130 provides a small pull-resistance that pulls the voltage of node 128 towards $V_{dd}$.

Node 128 is also connected ground node 142 through three series-connected transistors 136, 138 and 140.

The gate of transistor 136 is connected to the Cell Select control signal. In this implementation, transistor 136 is an n-type transistor, so when Cell Select has a high value, transistor 136 is conductive and when Cell Select has a low value, transistor 136 is non-conductive.

The gate of transistor 138 is connected to the Cell Write control signal. In this implementation, transistor 138 is an n-type transistor, so when Cell Write has a high value, transistor 138 is conductive and when Cell Write has a low value, transistor 138 is non-conductive.

The gate of transistor 140 is connected to the Cell Data control signal. In this implementation, transistor 140 is an n-type transistor, so when Cell Data has a high value, transistor 140 is conductive and when Cell Data has a low value, transistor 140 is non-conductive.

Node 128 is also connected to the gate of transistor 114.

In a default state of storage cell 100, the Cell Select, Cell Write, and Cell Data control inputs to transistors 136, 138, and 140 are set to low values. As a result, transistors 136, 138, and 140 are not conductive and node 129 is pulled up to Vdd by transistor 130. Because node 128 has a high value, transistor 114 is placed into a non-conductive state. The value of node 129 is inverted, however, at node 126 so that node 126 has a low value. The low value of node 126 causes transistor 112 to be conductive. Even though transistor 112 is conductive (and transistor no is biased into a conductive mode), no charge flows into capacitor 102 because transistor 114 is not conducting. In this default state, therefore, no charge is added to capacitor 102 and a voltage across capacitor 102 can be read at node 108.

To write a value to storage cell 100 (i.e., to add charge to capacitor 102), the Cell Select, Cell Write, and Cell Data control inputs to transistors 136, 138, and 140, respectively, are set to high values, causing transistors 136, 138, and 140 to become conductive. With transistors 136, 138, and 140 conductive, the voltage at node 128 is pulled down to the voltage of ground node 142. When node 142 goes to a high value, transistor 114 is placed into a conducting mode. At this time, transistors 114, 112, and 110 are all conductive causing charge to be added to capacitor 102.

A short time later, however, inverter 117 inverts the low value at node 128 into a high value at output node 126. When node 126 goes high, transistor 112 is placed into a non-conductive mode and the charging of capacitor 102 stops.

As a consequence, capacitor 102 is only charged for a short time. In the example circuit of FIG. 5, the charge period lasts approximately 715 pico seconds. In that arrangement, the change in charge on the capacitor is between 0.8 and 1.75 femto Coulombs, with an average change of 1.125 femto Coulombs. The current (derived from these values) varies between 1.14 and 2.46 micro Amps, with an average of 1.57 micro Amps. The higher charge changes occur when the initial voltage on the capacitor is lower during a particular write cycle. As the voltage across the capacitor approaches Vdd, the changes in charge that result from a particular write operation get smaller.

In general, the capacitor is only charged for a time period equal to the amount of time required for inverter 117 to operate plus the amount of time required by transistor 112 to change from a conductive state to a non-conductive mode minus the amount of time required for transistor 114 to enter a conductive mode from a non-conductive mode. The duration of the charging transaction is mostly dependent on the sizing of pmos transistor 118. Increasing the width of transistor 118 will cause the transistor to charge node 126 faster, resulting in a shorter charging period.

Increasing the width of transistor 112 would add capacitance to node 126 (due to larger gate capacitance from transistor 112), increasing the time required for pmos transistor 118 to charge that line to a high value. This would result in a longer charging period.

Additionally, increasing the width of transistor 112 can improve the transistor's conductance, meaning that the transistor could add more charge to the capacitor 102 in a given amount of time.

Increasing the width of transistor 118 would allow for more charging steps before reaching the highest possible value on the capacitor 102. The trade-off in such an arrangement is that the area consumed by a larger pmos transistor and the capability of the voltage comparator 44 to correctly distinguish the difference of voltages at the higher resolution.

Accordingly, the circuit shown in FIG. 5 is configured to allow only a small amount of charge to be added to capacitor 102 each time that the Cell Select, Cell Write, and Cell Data control inputs go high. Additionally, during each charge or write operation, a well-controlled amount of charge is added to capacitor 102 regardless of the time period during which the Cell Select, Cell Write, and Cell Data control inputs are held high. As a result, the storage cell (and resulting binary predictor) behaves in a predictable manner, only adding a known amount of charge to capacitor 102 regardless of the timing design of the external system (e.g., a microprocessor). For example, even if the present predictor is implemented in processors having different clock periods, the same amount of charge will be added to capacitor 102 each time the storage cell performs a write.

Figure 6:
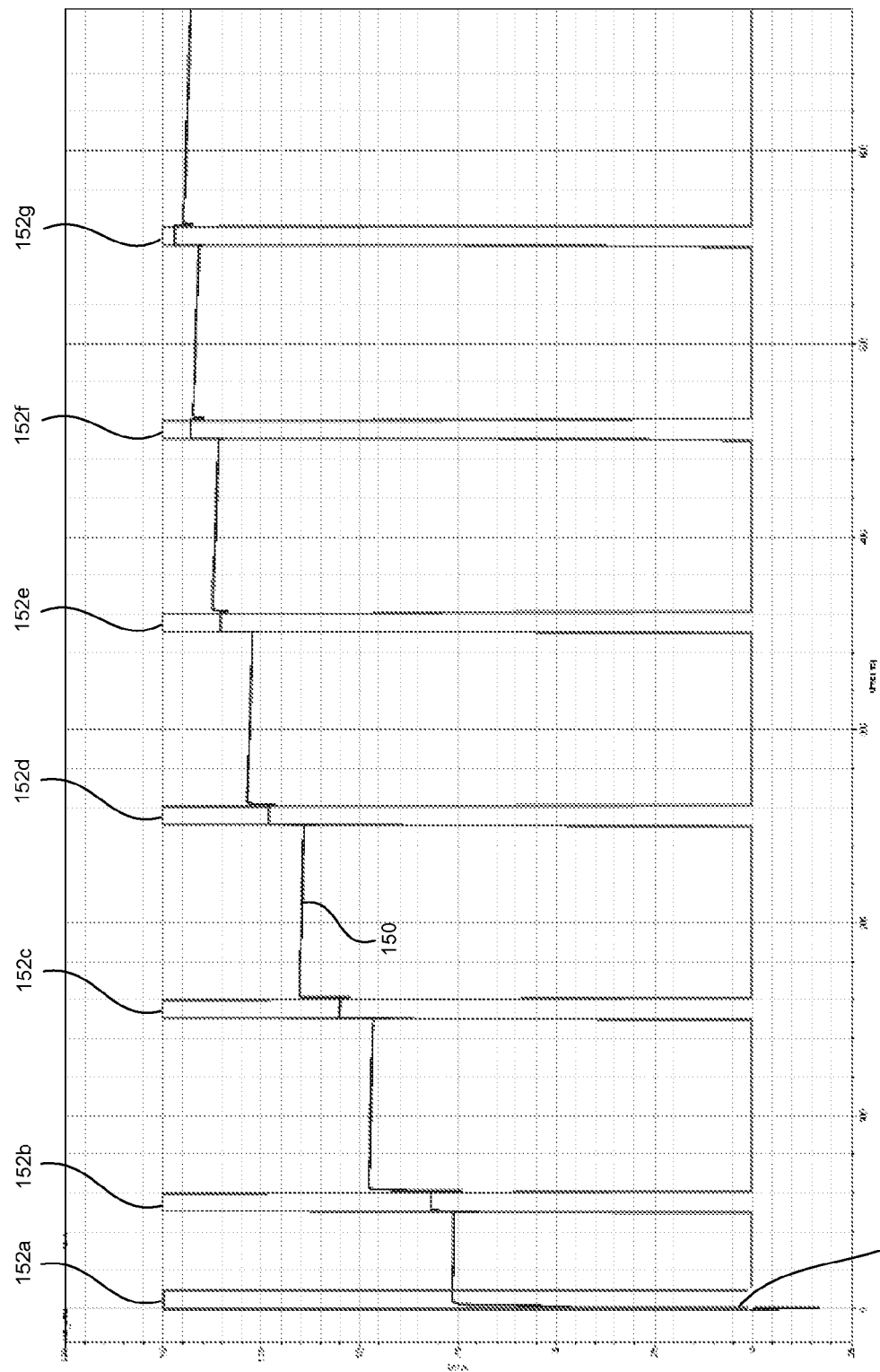
FIG. 6 is a graph showing a first waveform representative of the voltage across a capacitor of a storage cell and a second waveform showing a number of charging pulses being supplied to the capacitor.

As an illustration, FIG. 6 is a graph showing a first waveform representative of the voltage across capacitor 106 and a second waveform showing a number of charging pulses being supplied to the capacitor. As shown in FIG. 6, the voltage across capacitor 102 is initially zero. An initial charge pulse 152a is supplied to the capacitor causing the voltage across the capacitor to jump correspondingly. The duration of charge pulse 152a is limited (as is the corresponding amount of charge supplied to the capacitor) due to the operation of inverter 117 (see FIG. 5), as described above. Following charge pulse 152a, a number of additional charge pulses 152b-152g are supplied to the capacitor, with each subsequent charge pulse resulting in a reduced increase in the voltage across the capacitor. When a charge pulse is not being supplied to the capacitor, the voltage across the capacitor is slowly reduced due to leakage through resistor 104 (see FIG. 5).

Returning to FIG. 5, storage cell 100 may include transistors having varying geometry. In one implementation, transistors 136, 138, 140, and 118 are formed in a substrate and have widths of approximately 600 nanometers and lengths of approximately 200 nanometers. In that case, transistors no and 130, which operate as resistors or buffers, have widths of approximately 300 nanometers and lengths of approximately 1.2 micrometers. The increased lengths of transistors 110 and 130 increase the resistance of those transistors. Additionally, transistors 120, 114, and 112 have widths of approximately 300 nanometers and lengths of approximately 200 nanometers.

By controlling the geometries of transistors 118 and 120 (making up inverter 117), as well as the geometry of transistor 114 it is possible to control the time duration during which charge is added to capacitor 102 each time Cell Select, Cell Write, and Cell Data control inputs go high. In general, the time period is selected to be as short as possible, while still allowing for both transistors 114 and 112 to be in a conductive state at the same time.

In systems using capacitors having a higher capacitance, the incremental increase in charge resulting from any particular charging pulse is reduced. Accordingly, for larger capacitors, there is some risk that the initial charging pulse (occurring when the capacitor is at a zero or near-zero voltage) will be insufficient to cause the voltage across the capacitor to be raised to a level exceeding an activation threshold necessary to allow the comparator to correctly read and asses the voltage in the storage cell. Using such a capacitor, it may, therefore, require several "writes" (from zero charge in the storage cell) for the memory cell to register a change in decision.

To alleviate this problem, the storage cell may be arranged with two separate charging paths for the capacitor. The first path supplies charge to the capacitor as discussed above, while the second path only supplies charge to the capacitor if the charge stored in the cell is below a particular threshold value.

Figure 7:
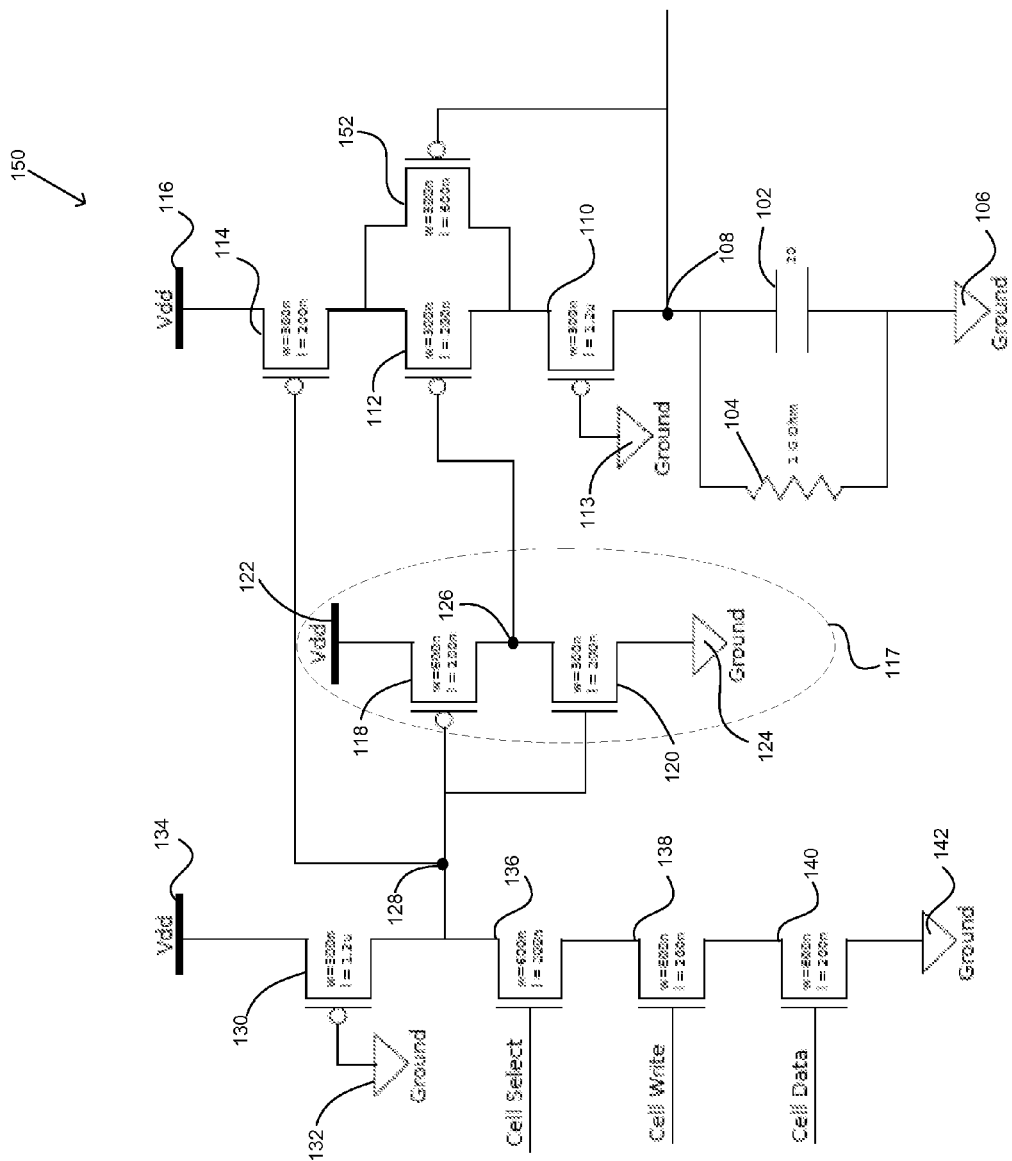
FIG. 7 is a circuit diagram of a storage cell including a secondary charging path connected to the capacitor.

FIG. 7 shows an example storage cell 150 including a secondary charging path to ensure that the charge stored at the capacitor exceeds a threshold value after the capacitor is subject to an initial charge signal. The circuit of FIG. 7 is substantially the same as the circuit shown in FIG. 5, except for the differences noted below.

As shown in FIG. 7, p-type transistor 152 is connected between transistor 114 and output node 108. Transistor 152 will conduct when a voltage at the transistor's gate is below a particular threshold, but will stop conducting when the voltage at the transistor's gate is above a particular threshold. The gate of transistor 152 is connected to node 108. As such, the voltage across capacitor 102 controls whether transistor 152 conducts. If the voltage is of capacitor 102 is too high, transistor 152 does not conduct. If too low, transistor 152 conducts.

As described below, transistor 152 provides a secondary charging path to ensure that an initial charge to capacitor 102 is sufficiently large to ensure that the capacitor's charge is large enough to exceed a threshold value for measurement. Once that threshold charge of capacitor 102 is achieved, however, the secondary charge path through transistor 152 is shutdown so that future charges of capacitor 102 only add a small amount of charge to the capacitor through the first charging path (transistors 114, 112, and 110). Generally, the threshold voltage that controls whether transistor 152 conducts is set equal to the minimum voltage of capacitor 102 that can be measured by an attached voltage comparator.

When capacitor 102 is at a low charge (i.e., a charge too low to be measured by a connected voltage comparator), transistor 152 is put into a conductive mode because the value of node 108 is sufficiently low to put transistor 152 into a conductive mode. When charge is to be supplied to capacitor 102, the Cell Select, Cell Write, and Cell Data control lines are set to high values. This pulls node 128 to ground causing transistor 114 to enter a conductive mode. At this time, charge enters capacitor 102 through two charging paths. The first through transistors 114 and 112 and the second through transistors 114 and 152. Eventually, inverter 117 operates, causing node 126 to go high, putting transistor 112 into a non-conductive mode. At this time, the first charging path (through transistors 114 and 112) shuts down, but energy continues to flow to capacitor 102 through the second charging path (through transistors 114 and 152).

Eventually, as charge flows into capacitor 102, the voltage across capacitor 102 becomes sufficient to cause the voltage at node 108 to rise sufficiently causing transistor 152 to enter a non-conductive mode. At that point, charging of capacitor 102 through the second charging path stops. At this time, sufficient charge is stored in capacitor 102 so that external circuits (e.g., a voltage comparator) can measure the voltage across capacitor 102.

Upon additional write actions, charge will only enter capacitor 102 through the first charge path (transistors 114 and 112) and only for a short periods of time—due to the action of inverter 117, and the second charging path (transistors 114 and 152) is generally shutdown because transistor 152 is non-conductive.

Eventually, due to leakage or other activities, the voltage across capacitor 102 will fall below the threshold value, causing transistor 152 to once again conductive energy into capacitor 102 upon a following write cycle.

Figure 8A:
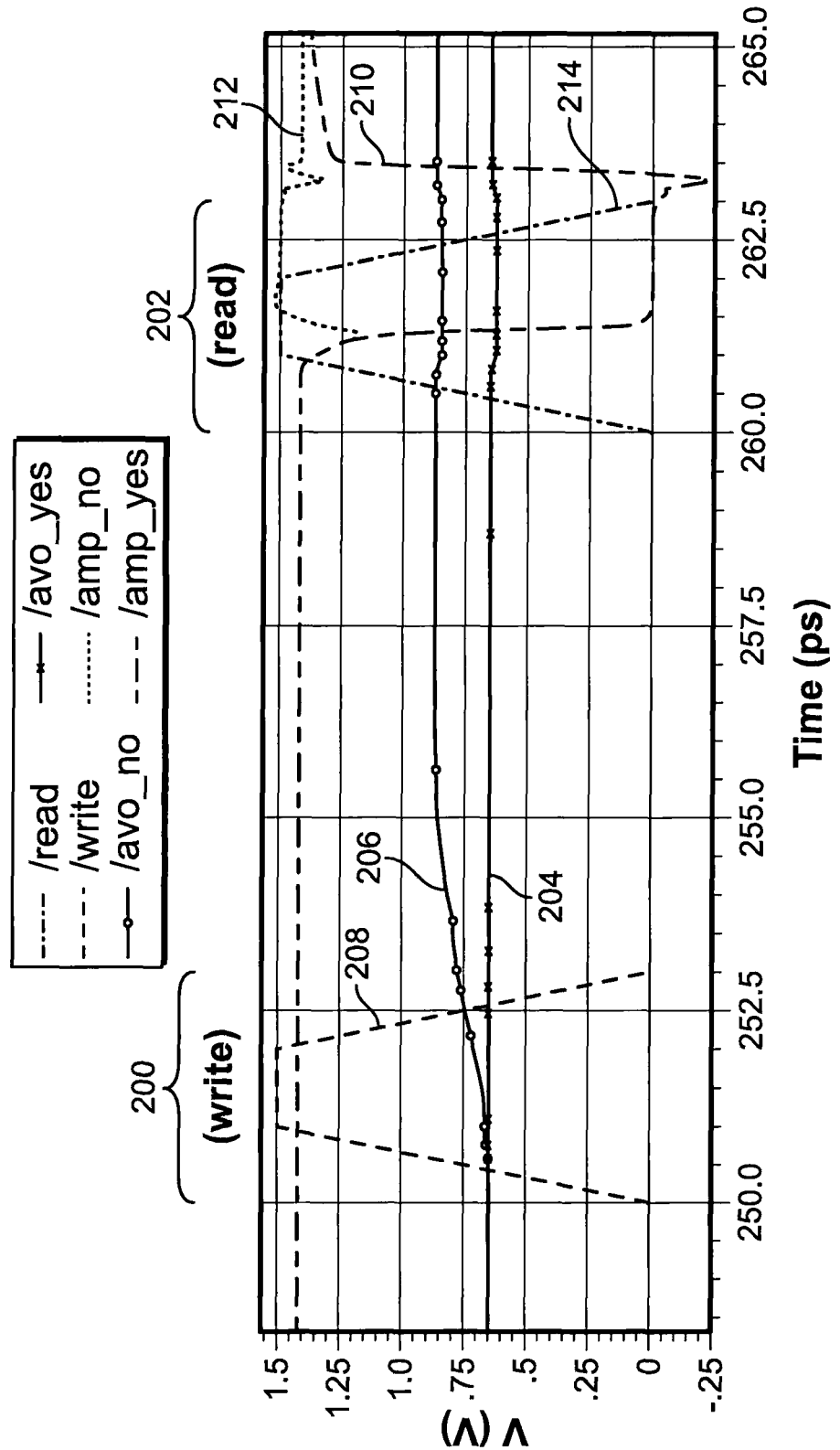
FIGS. 8A and 8B are graphs showing voltages for a number of nodes of the present memory cell during operation.
Figure 8B:
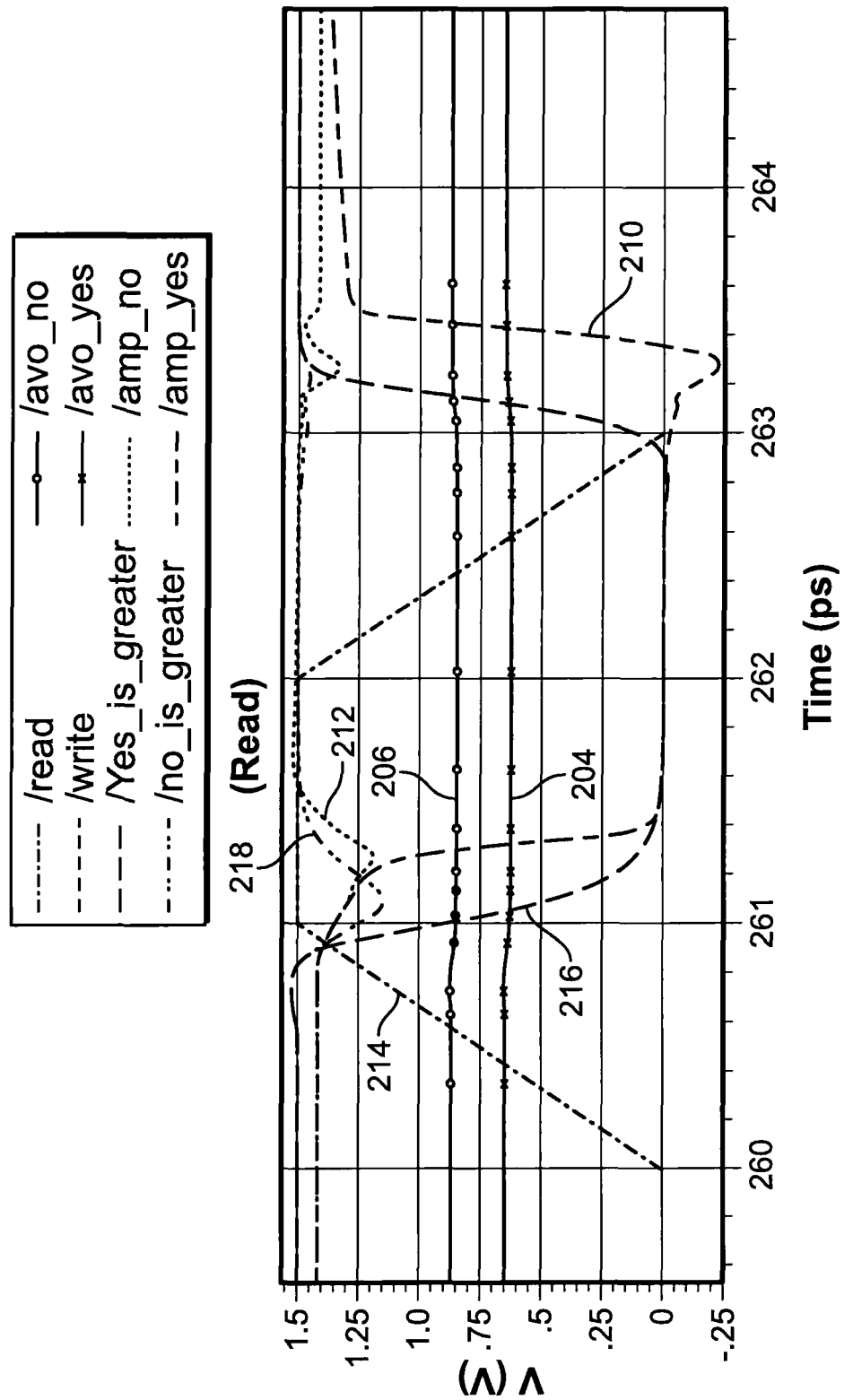

FIGS. 8A and 8B are graphs showing voltages for a number of nodes of the present memory cell during operation. The y-axis of each graph shows a voltage value, while the x-axis of each graphs shows time. FIG. 8A shows waveforms for both a write operation and a read operation, while FIG. 8B shows an enlarged view of the read operation waveform shown in FIG. 8A.

In FIG. 8A, the write action is indicated by element 200, while the read action is indicated by element 202. Line 208 shows the voltage of a write control line, such as the Cell Write control line 96 shown in FIG. 4. Line 204 shows the analog voltage of the "yes" storage cell of the memory cell and line 206 shows the analog voltage of the "no" storage cell of the memory cell.

Line 210 shows the amplified "yes" prediction (or output) of the entire memory cell, while line 212 shows the amplified "no" prediction (or output) of the entire memory cell. As seen in FIG. 8A, when a value is not being read from the memory cell, lines 210 and 212 can have approximately the same value. When a value is being read from the memory cell, however, the values of lines 210 and 212 diverge, as each line represents opposite binary outputs of the memory cell.

During write operation 200, the cell write control line 208 goes high indicating that a value should be written to the memory cell. In this example, the value being written to the memory is '0' or 'no'. Accordingly, the analog voltage of the "yes" cell (indicated by line 204) does not charge, but the analog voltage of the "no" cell (indicated by line 206) increases. Note that the increase in charge of the "no" cell (line 206) continues to increase somewhat even after the cell write control line 208 goes to zero. This results from the increased length of the transistors in the charging path to the capacitor and also the small capacitances associated with the channel, drain, and source of each transistor, which take time to move charge. This increase in voltage in the "no" storage cell causes the "no" storage cell to store a greater analog voltage value than the "yes" storage cell. As a result, when a value is read from the memory cell, after comparing the analog values of both the "yes" and "no" storage cells, the memory will output an amplified "no" Boolean value.

The read operation 202 of FIG. 8A is shown in more detail in FIG. 8B. FIG. 8B, however, also shows the voltage waveforms for the "yes" is greater (line 216) and "no" is greater (line 218) outputs of the analog voltage comparator operating within the memory cell (e.g., comparator 44 shown in FIG. 2).

As shown in FIG. 8B, during a read operation, the read control line 214 goes high. When the read control line goes high, the voltage comparator within the memory cell compares the analog values of the "yes" and "no" storage cells contained therein. As seen in FIG. 8B, because the "no" storage cell (line 206) is storing a greater analog value than the "yes" storage cell (line 204), the output of the memory cell's yes-is-greater output goes to a low value (line 216), while the no-is-greater output goes to a high value (line 218).

The outputs of the memory cell's internal voltage comparator are then read by an external comparator (e.g., differential sense amplifier 22 of FIG. 1). At this point the "yes" output of the memory cell (line 210) goes to a low value, and the "no" output of the memory cell (line 212) goes to a high value. These comparative outputs indicate that the output of the memory is "no", or a particular Boolean value associated with a low output.

Some of the functional units described in this specification have been labeled as modules in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

In the present system a number of transistors may be utilized to provide the functionality of the present memory system. The transistors may be fabricated using known semiconductor fabrication processes involving fabrication of the transistors over a silicon substrate. In other implementations of the present invention, though, other types of switching devices implemented using other types of materials or substrates may be utilized to provide the functionality of the present invention.

Modules may also be implemented in software for execution by various types of processors. An identified module of executable code may, for example, comprise one or more physical or logical blocks of computer instructions which may, for example, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

Reference to a signal bearing medium may take any form capable of generating a signal, causing a signal to be generated, or causing execution of a program of machine-readable instructions on a digital processing apparatus. A signal bearing medium may be embodied by a transmission line, a compact disk, digital-video disk, a magnetic tape, a Bernoulli drive, a magnetic disk, punch card, flash memory, integrated circuits, or other digital processing apparatus memory device.

The schematic flow chart diagrams included, if any, are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

This invention is described in preferred embodiments in the following description with reference to the Figures, in which like numbers represent the same or similar elements. Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Where, "data storage media," or "computer readable media" is used, Applicants mean an information storage medium in combination with the hardware, firmware, and/or software, needed to write information to, and read information from, that information storage medium. In certain embodiments, the information storage medium comprises a magnetic information storage medium, such as and without limitation, a magnetic disk, magnetic tape, and the like. In certain embodiments, the information storage medium comprises an optical information storage medium, such as and without limitation, a CD, DVD (Digital Versatile Disk), HD-DVD (High Definition DVD), BD (Blue-Ray Disk) and the like. In certain embodiments, the information storage medium comprises an electronic information storage medium, such as and without limitation, a PROM, EPROM, EEPROM, Flash PROM, compactflash, smartmedia, and the like. In certain embodiments, the information storage medium comprises a holographic information storage medium.

Reference is made throughout this specification to "signals." Signals can be any time varying electromagnetic waveform, whether or not encoded with recoverable information. Signals, within the scope of this specification, can be modulated, or not, according to any modulation or encoding scheme. Additionally, any Fourier component of a signal, or combination of Fourier components, should be considered itself a signal as that term is used throughout this specification.

While one or more embodiments of the present invention have been illustrated in detail, the skilled artisan will appreciate that modifications and adaptations to those embodiments may be made without department from the scope of the present invention as set forth in the following claims.

We claim:

1. A memory system, comprising:
   a plurality of memory cells, each memory cell including:
      a first storage cell including a first capacitor configured to store a first analog charge representing a first Boolean value;
      a second storage cell including a second capacitor configured to store a second analog charge representing a second Boolean value;
      a charging path configured to apply, for a first time duration, a voltage to the first capacitor or the second capacitor during a write operation;
      a voltage comparator configured to output a Boolean value based upon a comparison of the first analog charge and the second analog charge during a read operation; and
      a second charge path in electrical communication with the first capacitor, the second charge path being configured to, when a voltage of the first capacitor is less than a threshold, apply the voltage to the first capacitor to cause the voltage of the first capacitor to exceed the threshold during a write operation to the first capacitor.

2. The memory system of claim 1, wherein the first time duration is less than a duration of the write operation.

3. The memory system of claim 1, wherein the first capacitor or the second capacitor has a capacitance of approximately 1 femto Farad.

4. The memory system of claim 1, wherein the plurality of memory cells are addressable by a decoder.

5. The memory system of claim 1, wherein the voltage comparator includes a dynamic latched comparator.

6. The memory system of claim 1, wherein the memory system is in communication with a branch predictor of a microprocessor.

7. A memory system, comprising:
   a plurality of memory cells, each memory cell including:
      a storage cell including a capacitor configured to store a first analog charge representing a Boolean value;
      a charging path configured to apply, for a first time duration, a voltage to the capacitor during a write operation, the first time duration being less than a duration of the write operation;

a voltage comparator configured to output a Boolean value based upon a comparison of the first analog charge to a second analog charge during a read operation; and a second charge path in electrical communication with the capacitor, the second charge path being configured to, when a voltage of the capacitor is less than a threshold, supply a charge to the capacitor to cause the voltage of the capacitor to exceed the threshold.

8. The memory system of claim 7, wherein the first time duration is less than a duration of the write operation.

9. The memory system of claim 7, wherein the capacitor has a capacitance of approximately 20 femto Farads.

10. The memory system of claim 7, wherein the plurality of memory cells are addressable by a decoder.

11. The memory system of claim 7, wherein the voltage comparator includes a dynamic latched comparator.

12. The memory system of claim 7, wherein the memory system is in communication with a branch predictor of a microprocessor.

13. A memory cell, comprising:
a first storage cell including a first capacitor configured to store a first analog charge representing a first Boolean value;

a second storage cell including a second capacitor configured to store a second analog charge representing a second Boolean value;

a charging path configured to apply, for a first time duration, a voltage to the first capacitor or the second capacitor during a write operation;

a voltage comparator configured to output a Boolean value based upon a comparison of the first analog charge and the second analog charge during a read operation; and a second charge path in electrical communication with the first capacitor, the second charge path being configured to, when a voltage of the first capacitor is less than a threshold, apply the voltage to the first capacitor to cause the voltage of the first capacitor to exceed the threshold during a write operation to the first capacitor.

14. The memory cell of claim 13, wherein the first time duration is less than a duration of the write operation.

* * * * *